(12) United States Patent
Yuan

(10) Patent No.: US 11,189,732 B2
(45) Date of Patent: Nov. 30, 2021

(54) ARRAY SUBSTRATE INCLUDING A SUBSTRATE, A FIRST THIN FILM TRANSISTOR AND A SECOND THIN FILM TRANSISTOR, MANUFACTURING METHOD THEREOF, DISPLAY PANEL AND DISPLAY DEVICE

(71) Applicant: Xiamen Tianma Micro-Electronics Co., Ltd., Xiamen (CN)

(72) Inventor: Yong Yuan, Shanghai (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/727,952

(22) Filed: Dec. 27, 2019

(65) Prior Publication Data

US 2020/0135935 A1 Apr. 30, 2020

(30) Foreign Application Priority Data

Sep. 30, 2019 (CN) .......................... 201910944098.9

(51) Int. Cl.
*H01L 29/08* (2006.01)
*H01L 29/786* (2006.01)
(Continued)

(52) U.S. Cl.
CPC .... *H01L 29/78618* (2013.01); *H01L 27/1225* (2013.01); *H01L 27/1248* (2013.01); *H01L 27/1251* (2013.01); *H01L 27/1255* (2013.01); *H01L 27/1259* (2013.01); *H01L 29/4908* (2013.01); *H01L 29/518* (2013.01);
(Continued)

(58) Field of Classification Search
CPC ...................... H01L 29/78618; H01L 27/1225
See application file for complete search history.

(56) References Cited

U.S. PATENT DOCUMENTS 7,952,095 B2 * 5/2011 Oue .................... H01L 27/1274
257/59
2015/0194498 A1 * 7/2015 Yuan ................. H01L 29/78672
257/43
(Continued)

FOREIGN PATENT DOCUMENTS

CN 103295909 A 5/2016
CN 107004682 A 8/2017

*Primary Examiner* — Caleb E Henry
(74) *Attorney, Agent, or Firm* — Kilpatrick Townsend & Stockton, LLP

(57) ABSTRACT

An array substrate includes a substrate, a first thin film transistor, and a second thin film transistor, and the first thin film transistor and the second thin film transistor each are located on a same side of the substrate. The first thin film transistor includes a first active layer being a polysilicon layer, and the second thin film transistor includes a second active layer being an oxide semiconductor layer and includes a first contact layer and a second contact layer. The first contact layer is located between the substrate and the second active layer, the second contact layer is located on a side of the second active layer facing away from the substrate, the first contact layer and the second contact layer each are in contact with the second active layer, and the second active layer, the first contact layer, and the second contact layer each are island-shaped.

18 Claims, 9 Drawing Sheets

(51) Int. Cl.
 *H01L 27/12* (2006.01)
 *H01L 29/51* (2006.01)
 *H01L 29/49* (2006.01)
 *H01L 27/32* (2006.01)

(52) U.S. Cl.
 CPC .... *H01L 29/7869* (2013.01); *H01L 29/78633* (2013.01); *H01L 29/78648* (2013.01); *H01L 29/78675* (2013.01); *H01L 27/3262* (2013.01)

(56) References Cited

U.S. PATENT DOCUMENTS

| | | |
|---|---|---|
| 2016/0247831 A1* | 8/2016 | Makita ................ H01L 27/1248 |
| 2018/0145094 A1 | 5/2018 | Yan et al. |
| 2020/0350341 A1* | 11/2020 | Hanada .................... G09F 9/30 |

* cited by examiner

ARRAY SUBSTRATE INCLUDING A SUBSTRATE, A FIRST THIN FILM TRANSISTOR AND A SECOND THIN FILM TRANSISTOR, MANUFACTURING METHOD THEREOF, DISPLAY PANEL AND DISPLAY DEVICE

CROSS-REFERENCES TO RELATED APPLICATIONS

This application claims priority to a Chinese patent application No. 201910944098.9 filed on Sep. 30, 2019, the disclosure of which is incorporated herein by reference in its entirety.

TECHNICAL FIELD

The present disclosure relates to the field of display technologies and, in particular, relates to an array substrate and a manufacturing method thereof, a display panel, and a display device.

BACKGROUND

In a display panel where a driving circuit is formed by a thin film transistor, the electrical characteristics of the thin film transistor have a crucial effect on the display effect of the display panel. There are significant differences in electrical characteristics of thin film transistors using different materials as a semiconductor active layer. In one embodiment, a thin film transistor using a polysilicon layer as a semiconductor active layer has a large carrier mobility and has a strong driving ability; a thin film transistor using an oxide as a semiconductor active layer has a small leakage current and has excellent switching characteristics. Thin film transistors located at different positions of the driving circuit have different requirements for electrical characteristics, so in order to improve the operating performance of the driving circuit, a same display panel may include two or more different types of thin film transistors.

However, film layer characteristics and manufacturing processes of different types of thin film transistors are not quite the same, so in the manufacturing process and using process of the display panel, different types of thin film transistors will affect each other. Therefore, how to avoid the mutual influence between different types of thin film transistors in the display panel has become a technical problem to be solved urgently in the related art.

SUMMARY

In view of this, the present disclosure provides an array substrate and a manufacturing method thereof, a display panel and a display device, to solve the problem that different types of thin film transistors in the display panel will affect each other.

One embodiment of the present disclosure provides an array substrate. The array substrate includes: a substrate, a first thin film transistor, and a second thin film transistor, where the first thin film transistor and the second thin film transistor are located on a same side of the substrate.

The first thin film transistor includes a first active layer, the first active layer is a polysilicon layer, the second thin film transistor includes a second active layer, the second active layer is an oxide semiconductor layer, and the second thin film transistor further includes a first contact layer and a second contact layer. The first contact layer is located between the substrate and the second active layer, the second contact layer is located on a side of the second active layer facing away from the substrate, the first contact layer and the second contact layer each are in direct contact with the second active layer, and the second active layer, the first contact layer, and the second contact layer each are island-shaped.

One embodiment of the present disclosure provides a manufacturing method of an array substrate. The manufacturing method includes the following steps: a substrate is provided; a first active layer is formed on the substrate, where the first active layer is an active layer of a first thin film transistor and is a polysilicon layer; a first contact layer is formed on the substrate; a second active layer is formed on the first contact layer, where the second active layer is an active layer of a second thin film transistor and is an oxide semiconductor layer; and a second contact layer is formed on the second active layer; where the first contact layer and the second contact layer each are in direct contact with the second active layer, and the second active layer, the first contact layer, and the second contact layer each are island-shaped.

One embodiment of the present disclosure provides a display panel. The display panel includes the array substrate provided by any one of the embodiments of the present disclosure, and further includes a planarization layer and a light-emitting element layer, where the planarization layer is located between the array substrate and the light-emitting element layer.

One embodiment of the present disclosure provides a display device including the display panel provided by any one of the embodiments of the present disclosure.

Compared with the related art, the array substrate and the manufacturing method thereof, the display panel and the display device provided by the present disclosure have at least the following technical beneficial effects.

The array substrate includes the first thin film transistor and the second thin film transistor. In the second thin film transistor, the first contact layer and the second contact layer are respectively located on opposite sides of the second active layer and are each in direct contact with the second active layer, where the second active layer, the first contact layer, and the second contact layer each are island-shaped, so that the first contact layer and the second contact layer that are in direct contact with the second active layer are isolated from the related film layers, reducing the possibility of specific ions in the first thin film transistor affecting the second thin film transistor through diffusion and spreading in the film layers. In addition, the first contact layer and the second contact layer are respectively located on a lower side and an upper side of the second active layer, reducing the influence of the impurity ions on the second active layer in a direction where the film layers are stacked.

DETAILED DESCRIPTION

A driving circuit in a display panel is usually formed by a thin film transistor. Based on different requirements for driving circuits located in different positions of the display panel or different performance requirements for thin film transistors located in different positions in the same driving circuit, the driving circuit in the display panel may include two or more types of thin film transistors, to meet the performance requirements for the driving circuit.

The display panel includes a pixel driving circuit used for driving a light-emitting device to emit light. The pixel driving circuit may use a low-temperature polysilicon thin film transistor as a driving transistor and an oxide thin film transistor as a switch transistor. The active layer of the low-temperature polysilicon thin film transistor needs a hydrogen supplement process to reduce dangling bonds, improving the stability of the polysilicon active layer. However, a use of a high-temperature diffusion method to supplement hydrogen to the polysilicon active layer with hydrogen will cause hydrogen ions to diffuse in all directions, causing free hydrogen ions to act on the active layer of the oxide thin film transistor, robbing the oxygen in the metal oxide, and resulting in a large number of oxygen defects in the oxide, the oxide semiconductor layer to become conductive, and then a short circuit between the source and the drain of the oxide transistor. In addition, an inorganic layer surrounding the active layer of the low-temperature polysilicon thin film transistor is also rich in hydrogen ions at the same time. In a plurality of bending operations or a long-term use of the display panel, the diffusion of hydrogen ions will also affect the active layer of the oxide thin film transistor, especially when the low-temperature polysilicon thin film transistor and the oxide thin film transistor appear in the same driving circuit, the distance between the two transistors is small, making the influence between the two transistors more apparent.

In order to solve the above-mentioned technical problems, the present disclosure provides an array substrate and a manufacturing method thereof, a display panel and a display device.

Figure 1:
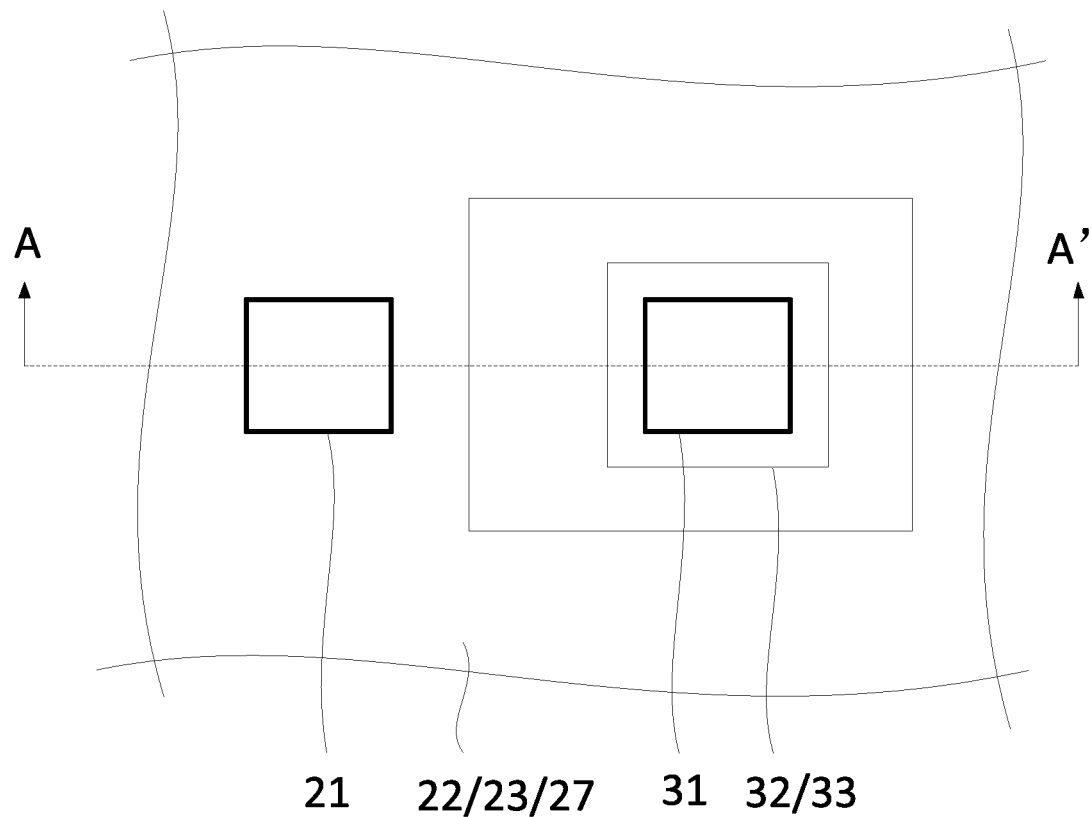
FIG. 1 is a partial cross-sectional view of an array substrate according to the present disclosure.
Figure 2:
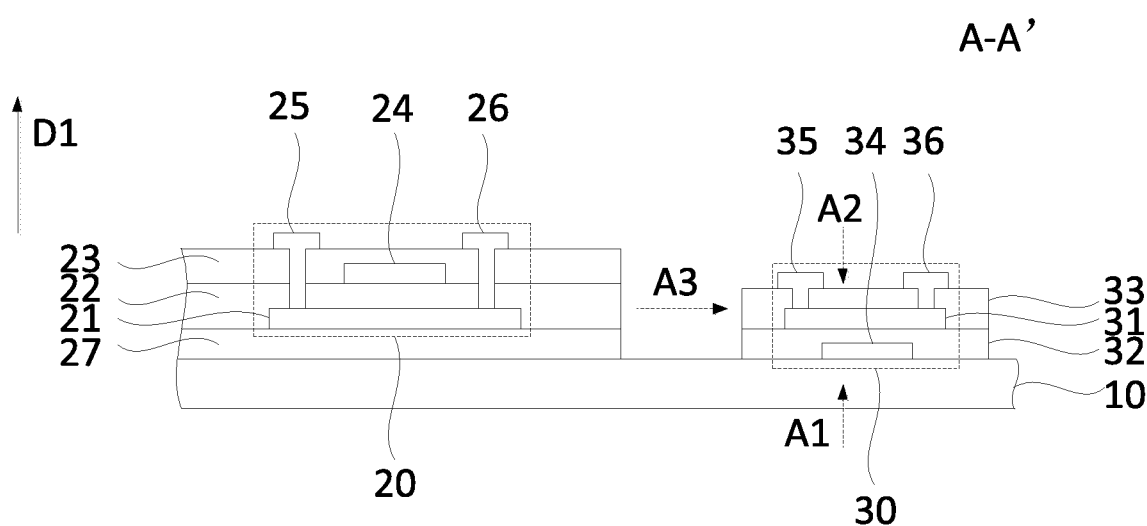
FIG. 2 is a cross-sectional view of FIG. 1 taken along line A-A'.

FIG. 1 is a partial top view of an array substrate according to an embodiment of the present disclosure, and FIG. 2 is a cross-sectional view of FIG. 1 taken along line A-A'. As shown in FIGS. 1 and 2, the array substrate provided by the present disclosure includes a substrate 10, a first thin film transistor 20, and a second thin film transistor 30, and the first thin film transistor 20 and the second thin film transistor 30 each are located on a same side of the substrate 10; the first thin film transistor 20 includes a first active layer 21 being a polysilicon layer, the second thin film transistor 30 includes a second active layer 31 being an oxide semiconductor layer and further includes a first contact layer 32 and a second contact layer 33, the first contact layer 32 is located between the substrate 10 and the second active layer 31, the second contact layer 33 is located on a side of the second active layer 31 facing away from the substrate 10, the first contact layer 32 and the second contact layer 33 each are in direct contact with the second active layer 31, and the second active layer 31, the first contact layer 32, and the second contact layer 33 each are island-shaped.

The substrate 10 may be a rigid substrate or a flexible substrate as a base for manufacturing the first thin film transistor 20 and the second thin film transistor 30. Materials for rigid substrates include glass, and materials for flexible substrates include one or more types of polymer materials, such as polyimide, polycarbonate, polyethersulfone, polyethylene terephthalate, polyethylene naphthalate, polyarylate, and glass fiber reinforced plastic.

The first thin film transistor 20 and the second thin film transistor 30 are located on the same side of the substrate 10. In a direction D1 perpendicular to the substrate 10, the first thin film transistor 20 and the second thin film transistor 30 do not overlap.

The first active layer 21 of the first thin film transistor 20 is a polysilicon layer. The first active layer 21 may be converted from an amorphous silicon layer, and the amorphous silicon layer is crystallized through a laser annealing process, forming the polysilicon layer. The first active layer 21 may be a low-temperature polysilicon thin film.

The second active layer 31 of the second thin film transistor 30 is an oxide semiconductor layer. The oxide semiconductor layer may be made of a material based on zinc oxide or an oxide semiconductor material including indium. In one embodiment, the oxide semiconductor material may be zinc oxide (ZO), indium gallium zinc oxide (IGZO), zinc tin oxide (ZTO), zinc indium oxide (ZIO), or the like.

The shapes of the first active layer 21 and the second active layer 31 may be set according to actual needs, which is not specifically limited in the present disclosure.

The first contact layer 32 and the second contact layer 33 are respectively located on a side of the second active layer 31 facing toward the substrate 10 and a side of the second active layer 31 facing away from the substrate 10, and are each in direct contact with the second active layer 31. The first contact layer 32 can prevent the free hydrogen ions in the film layers located on a side of the first contact layer 32 facing away from the second active layer 31 from diffusing into the second active layer 31, a diffusion direction as shown by the dashed arrow A1 in FIG. 2. Similarly, the second contact layer 33 can prevent the free hydrogen ions in film layers located on a side of the second contact layer 33 facing away from the second active layer 31 from diffusing into the second active layer 31, a diffusion direction as shown by the dashed arrow A2 in FIG. 2. Therefore, in the direction D1 perpendicular to the substrate 10, the first contact layer 32 and the second contact layer 33 can prevent the influence of hydrogen ions on the second active layer 31.

The first contact layer 32 and the second contact layer 33 each are made of a material of silicon oxide. A distance of general bonds in silicon oxide is about 0.151 nm, while a distance of hydrogen bonds is about 0.2 nm. Therefore, silicon oxide can effectively prevent hydrogen atoms from overflowing outwards and become a good hydrogen blocking layer. Thus, the first contact layer 32 and the second contact layer 33 can effectively prevent hydrogen ions from entering the second active layer 31 through the first contact layer 32 and the second contact layer 33.

In one embodiment, edges of the first contact layer 32 and the second contact layer 33 may both be located outside the edge of the second active layer 31, and therefore, an edge portion of the first contact layer 32 is in contact with an edge portion of the second contact layer 33 to form a structure with which the second active layer 31 is stereoscopically surrounded.

The first contact layer 32 and the second contact layer 33 each are island-shaped. The first contact layer 32 and the second contact layer 33 may have independent block patterns, that is, the first contact layer 32 and the second contact layer 33 are not formed by film layers in other positions extending to the second thin film transistor 30 in a direction parallel to the substrate 10. In one embodiment, the first contact layer 32 and the second contact layer 33 are not formed by the insulating layers corresponding to the first thin film transistor 20 extending to the second thin film transistor 30, so that diffusion paths of hydrogen ions in the film layers corresponding to the first thin film transistor 20 in the film layer extending direction are removed, where the diffusion direction is as shown by the dashed arrow A3 in FIG. 2. The case of diffusion of hydrogen ions in the first thin film transistor 20 to the second active layer 31 of the second thin film transistor 30 in a direction parallel to the substrate 10 is reduced, reducing the influence of the adjacent first thin film transistor 20 on the second thin film transistor 30.

Patterns of the first contact layer 32 and the second contact layer 33 may be the same as the shape of the second active layer 31, or may be specifically set according to actual needs, and the shape of the first contact layer 32 and the shape of the second contact layer 33 may be the same or different. The shape of the first contact layer 32 and the shape of the second contact layer 33 are not specifically limited in the present disclosure.

The array substrate includes a first thin film transistor and a second thin film transistor. In the second thin film transistor, the first contact layer and the second contact layer are respectively located on opposite sides of the second active layer, and are each in direct contact with the second active layer, where the second active layer, the first contact layer, and the second contact layer each are island-shaped, so that the first contact layer and the second contact layer that are in direct contact with the second active layer are isolated from the related film layers, reducing the possibility of specific ions in the first thin film transistor affecting the second thin film transistor through diffusion and spreading in the film layers. In addition, the first contact layer and the second contact layer are respectively located on a lower side and an upper side of the second active layer, reducing the influence of the impurity ions on the second active layer in a direction where the film layers are stacked.

In the direction D1 perpendicular to the substrate 10, the first thin film transistor 20 and the second thin film transistor 30 may have different relative positional relationships.

One of the relative positional relationships between the first thin film transistor 20 and the second thin film transistor 30 in a direction perpendicular to the substrate 10 may be referred to FIGS. 1 and 2. As shown in FIGS. 1 and 2, all insulating layers in the first thin film transistor 20 and all insulating layers in the second thin film transistor 30 are disconnected from each other, none of the insulating layers in the first thin film transistor 20 extends to a position between the second thin film transistor 30 and the substrate 10, and a distance between the first thin film transistor 20 and the substrate 10 is not much different from a distance between the second thin film transistor 30 and the substrate 10. Therefore, the number of film layers of the array substrate is small and the thickness of the array substrate is small, which are beneficial for implementing bending.

In one embodiment, referring to FIGS. 1 and 2, the film layers of the first thin film transistor 20 and the film layers of the second thin film transistor 30 are set as follows: the first thin film transistor 20 and the second thin film transistor 30 are located on a same side of the substrate 10. For the first thin film transistor 20, a buffer layer 27, a first active layer 21, a first gate insulating layer 22, a first gate 24, a first interlayer insulating layer 23, and a first source 25/a first drain 26 (the first source 25 and the first drain 26 may be disposed at the same layer) are provided in sequence on the substrate 10, where the first source 25 and the first drain 26 are separately connected to the first active layer 21. For the second thin film transistor 30, a second gate 34, a first contact layer 32, a second active layer 31, a second contact layer 33, and a second source 35/a second drain 36 (the second source 35 and the second drain 36 may be disposed at the same layer) are provided in sequence on the substrate 10, where the second source 35 and the second drain 36 are separately connected to the second active layer 31. The first contact layer 32 may be disposed at the same layer as the buffer layer 27, and the second contact layer may be disposed at the same layer as the first gate insulating layer 22 or the first interlayer insulating layer 23.

The buffer layer 27 is located on the substrate 10 and may include an inorganic layer or an organic layer. In one embodiment, the buffer layer 27 may be made of one or more inorganic materials such as silicon oxide, silicon nitride and silicon oxynitride, or the buffer layer 27 may be made of one or more organic materials such as acrylic, polyimide, or polyester. The buffer layer 27 may include a single layer or a plurality of stacked film layers. The buffer layer 27 blocks oxygen and moisture, prevents moisture or impurities from diffusing through the substrate 10, and provides a flat surface on an upper surface of the substrate 10.

Figure 5:
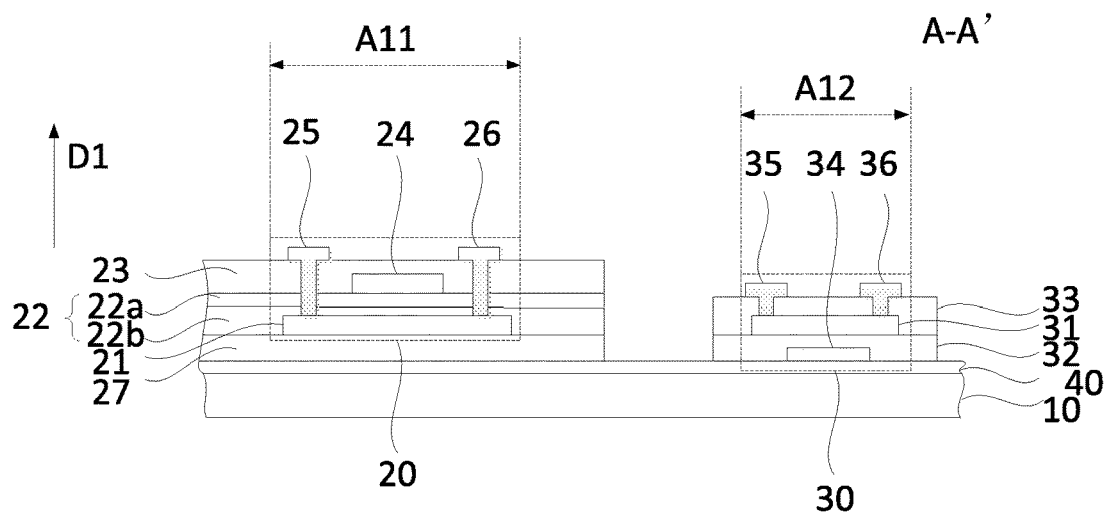
FIG. 5 is a cross-sectional view of FIG. 1 taken along line A-A'.

The first gate insulating layer 22 is located between the first active layer 21 and the first gate 24. The first gate insulating layer 22 may be made of a material including one or more inorganic materials such as silicon oxide, silicon nitride, and silicon oxynitride. The first gate insulating layer 22 may be provided as a single layer or as two stacked layers. FIG. 5 is a cross-sectional view of FIG. 1 taken along line A-A'. As shown in FIG. 5, when the first gate insulating layer 22 is provided as two layers, one of the two layers is a silicon nitride layer 22a, the other layer of the two layers is a silicon oxide layer 22b, the silicon nitride layer 22a is in direct contact with the first gate 24, and the silicon oxide layer 22b is in direct contact with the first active layer 21.

The first interlayer insulating layer 23 is located between the first gate 24 and the first source 25/first drain 26, and the first interlayer insulating layer 23 may be made of a material including an inorganic layer, such as silicon oxide and aluminum oxide.

Figure 3:
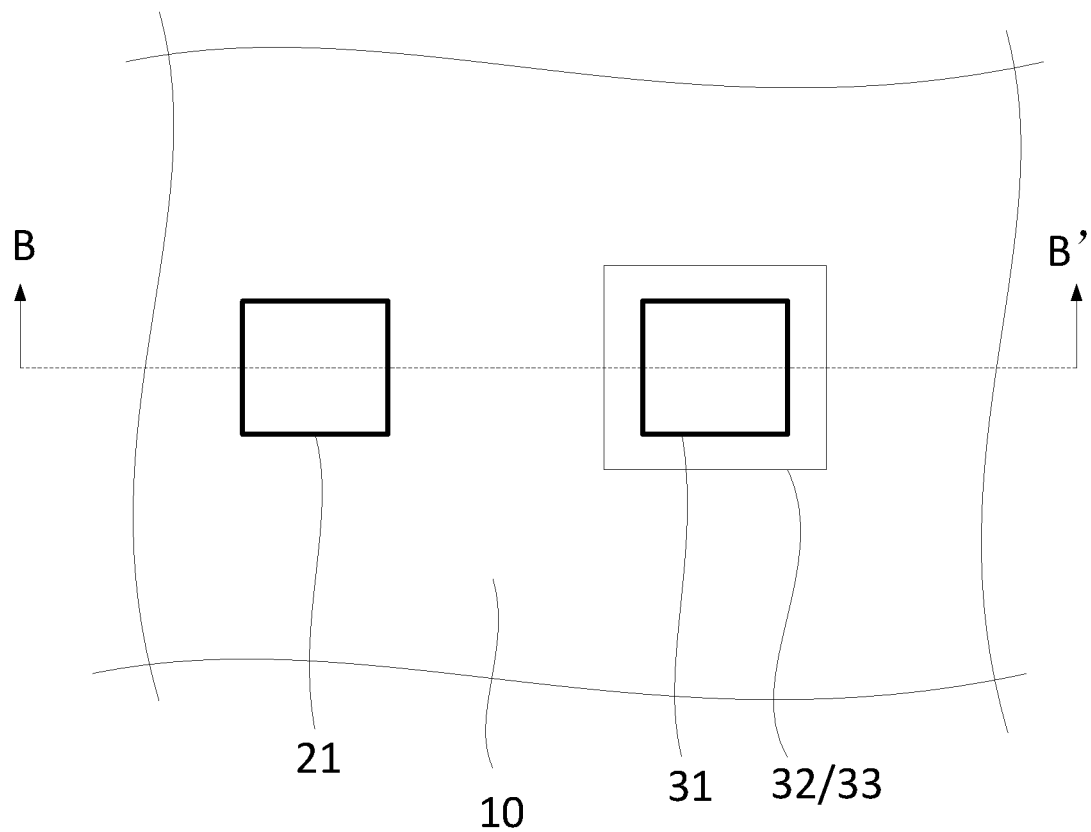
FIG. 3 is a partial top view of another array substrate according to an embodiment of the present disclosure.
Figure 4:
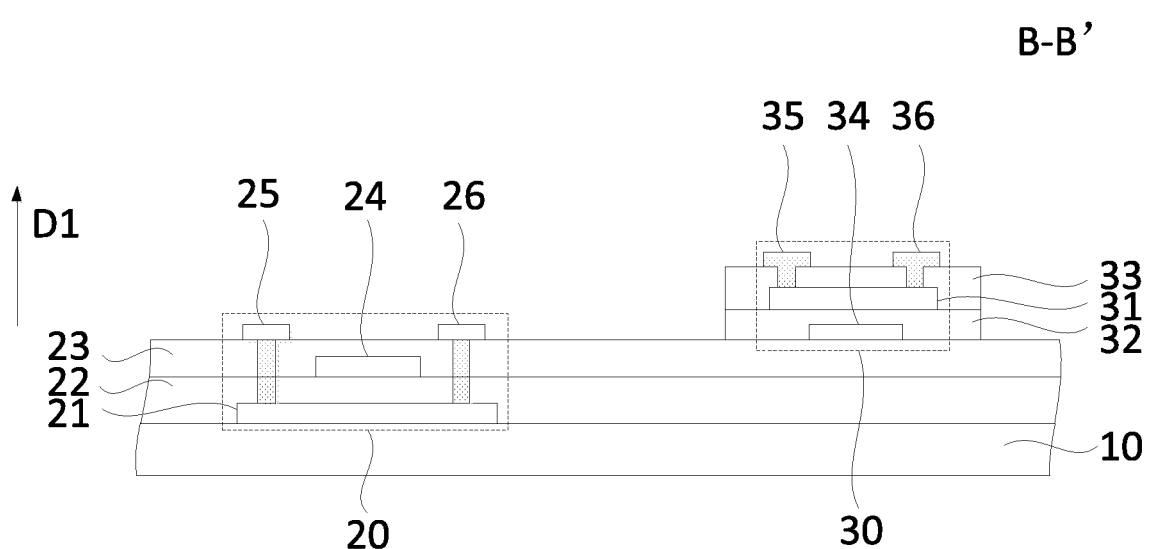
FIG. 4 is a cross-sectional view of FIG. 3 taken along line B-B'.

Another relative positional relationship between the first thin film transistor 20 and the second thin film transistor 30 in the direction perpendicular to the substrate 10 may be referred to FIGS. 3 and 4. FIG. 3 is a partial top view of another array substrate according to an embodiment of the present disclosure, and FIG. 4 is a cross-sectional view of FIG. 3 taken along line B-B'. As shown in FIGS. 3 and 4, all insulating layers in the first thin film transistor 20 extend to a position between the second thin film transistor 30 and the substrate 10. The second thin film transistor 30 may be manufactured after the manufacturing of the first thin film transistor 20 is completed, to reduce the influence of the manufacturing process of the first thin film transistor 20 on the second thin film transistor 30. One embodiment of the first contact layer 32 and the second contact layer 33 are independently provided and are island-shaped, compared to a case where the insulating layer in the first thin film transistor 20 extends to the second thin film transistor 30 to form the first contact layer and the second contact layer, in a plane parallel to the substrate 10, a path for hydrogen ions in the first active layer 21 of the first thin film transistor 20 to diffuse along the film layer to the second active layer 31 of the second thin film transistor 30 is removed; in another embodiment in the direction perpendicular to the substrate 10, the first contact layer 32 prevents the free hydrogen ions of the first thin film transistor 20 diffusing to a position between the first contact layer 32 and the substrate 10 from affecting the second active layer 31.

In one embodiment, FIGS. 3 and 4 are referred to and have at least the following differences compared with FIGS. 1 and 2. The first gate insulating layer 22 and the first interlayer insulating layer 23 each extend toward the second film transistor 30, and overlap the second thin film transistor 30 in the direction D1 perpendicular to the substrate 10. The second thin film transistor 30 is located on a side of the first interlayer insulating layer 23 facing away from the substrate 10.

Considering the problem of mutual influence between the first thin film transistor 20 and the second thin film transistor 30, the array substrate may further include an isolation layer. A position of the isolation layer in the array substrate may be set as follows.

In one embodiment, as shown in FIG. 5, in a region A12 where the second thin film transistor 30 is located, the isolation layer 40 is located between the first contact layer 32 and the substrate 10 and may be disposed in direct contact with the substrate 10, or another film layer is provided between the substrate 10 and isolation layer 40. The isolation layer 40 extends from the region A12 where the second thin film transistor 30 is located toward the region A11 where the first thin film transistor 20 is located, and extends to a position between the first thin film transistor 20 and the substrate 10. The isolation layer 40 overlaps the first thin film transistor 20. The isolation layer 40 may cover the entire upper surface of the substrate 10.

The isolation layer 40 is provided between the first thin film transistor 20 and the substrate 10 and between the second thin film transistor 30 and the substrate 10, so that the impurity ions in the substrate 10 can be isolated from affecting the first thin film transistor 20 and the second thin film transistor 30.

Figure 6:
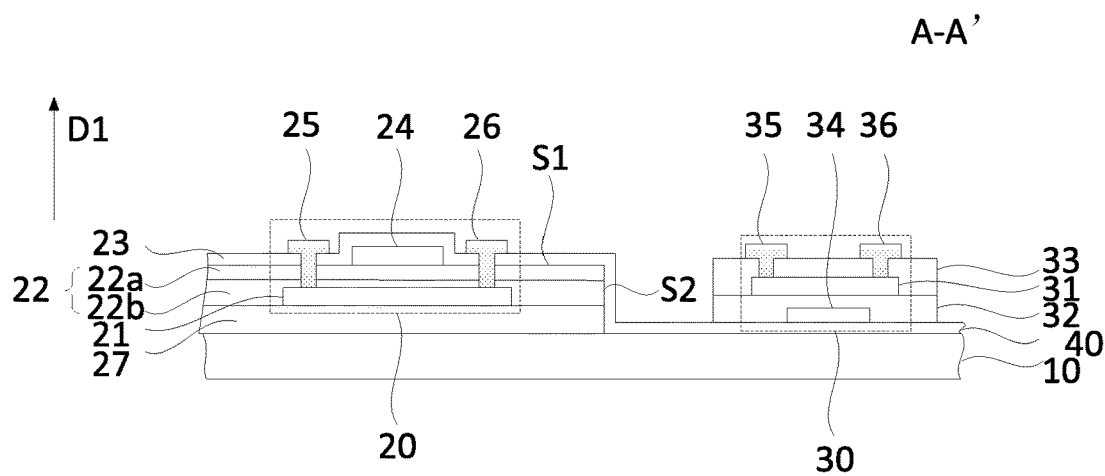
FIG. 6 is a cross-sectional view of FIG. 1 taken along line A-A'.

In one embodiment, as shown in FIG. 6, FIG. 6 is a cross-sectional view of FIG. 1 taken along line A-A'. Compared with the embodiment as shown in FIG. 5, the embodiment as shown in FIG. 6 has at least the following differences: the isolation layer 40 extends from a region where the second thin film transistor 30 is located to a region where the first thin film transistor 20 is located, and forms a first interlayer insulating layer 23 of the first thin film transistor 20 in a region where the first thin film transistor 20 is located.

In the direction D1 perpendicular to the substrate 10, the buffer layer 27 and the first gate insulating layer 22 each do not overlap the second active layer 31, the first contact layer 32, and the second contact layer 33. At this moment, the first interlayer insulating layer 23 covers not only the upper surfaces S1 of the first gate insulating layer 22 and the first gate 24 but also a cross-section S2 on a side of the first gate insulating layer 22 and the buffer layer 27 facing toward the adjacent second thin film transistor 30.

The first gate insulating layer 22 and the buffer layer 27 in the first thin film transistor 20 extend and stop in a position close to the second thin film transistor 30 and form the cross-section S2. The isolation layer 40 covers the cross-section S2 to form an isolation structure between the second thin film transistor 30 and the first thin film transistors 20. In addition, the first gate insulating layer 22 and the buffer layer 27 do not extend to the region where the second thin film transistor 30 is located, reducing the number of film layers in the region where the second thin film transistor 30 is located, and reducing the thickness of the array substrate, which is beneficial for bending of the array substrate. In the embodiment, the second thin film transistor 30 may be manufactured after the buffer layer, the first active layer 21, the first gate insulating layer 22, the first gate 24, and other film layers of the first thin film transistor 20 are formed. Therefore, the influence of the involved high-temperature manufacturing process of the related film layers in the first thin film transistor 20 on the second thin film transistor 30 can be avoided.

Figure 7:
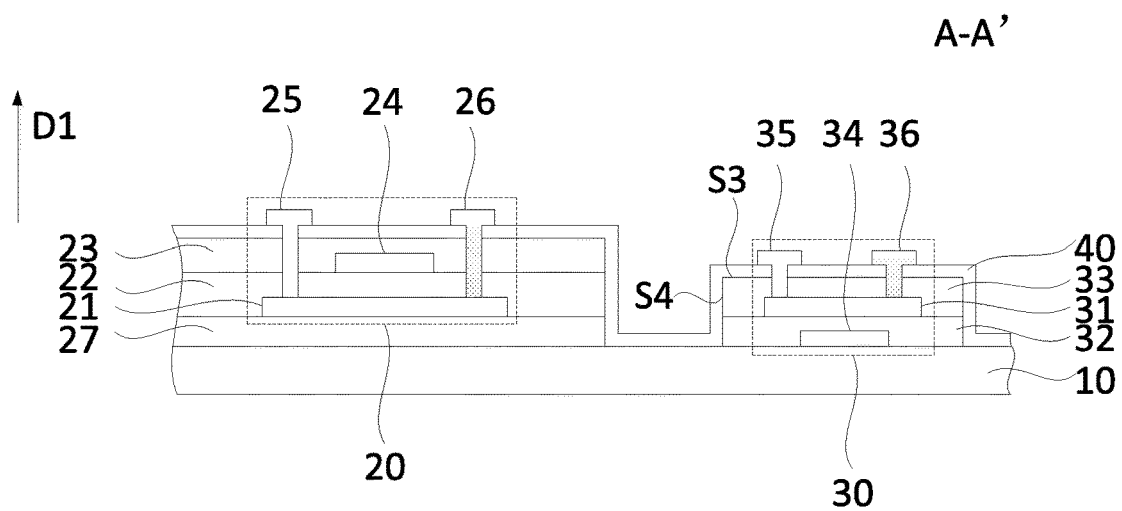
FIG. 7 is a cross-sectional view of FIG. 1 taken along line A-A'.

In one embodiment, as shown in FIG. 7, FIG. 7 is a cross-sectional view of FIG. 1 taken along line A-A'; the isolation layer 40 is located on a side of the second contact layer 33 facing away from the substrate 10, covers the second contact layer 33, covers an upper surface S3 of the second contact layer 33, and may also cover side surfaces S4 of the first contact layer 32 and the second contact layer 33. The isolation layer 40 may extend from the region where the second thin film transistor 30 is located to the region where the first thin film transistor 20 is located, and cover the first interlayer insulating layer 23 of the first thin film transistor 20. The first source 25/the first drain 26 may pass through a through hole to be connected to the first active layer 21.

The isolation layer 40 is provided on a side of the second contact layer 33 facing away from the substrate 10 and the isolation layer 40 covers the second contact layer 33 and part of the film layers in the first thin film transistor 20, so that the ions in the film layers on a side of the second contact layer 33 facing away from the substrate 10 can be isolated from affecting the electrical characteristics of the second active layer 31.

Figure 8:
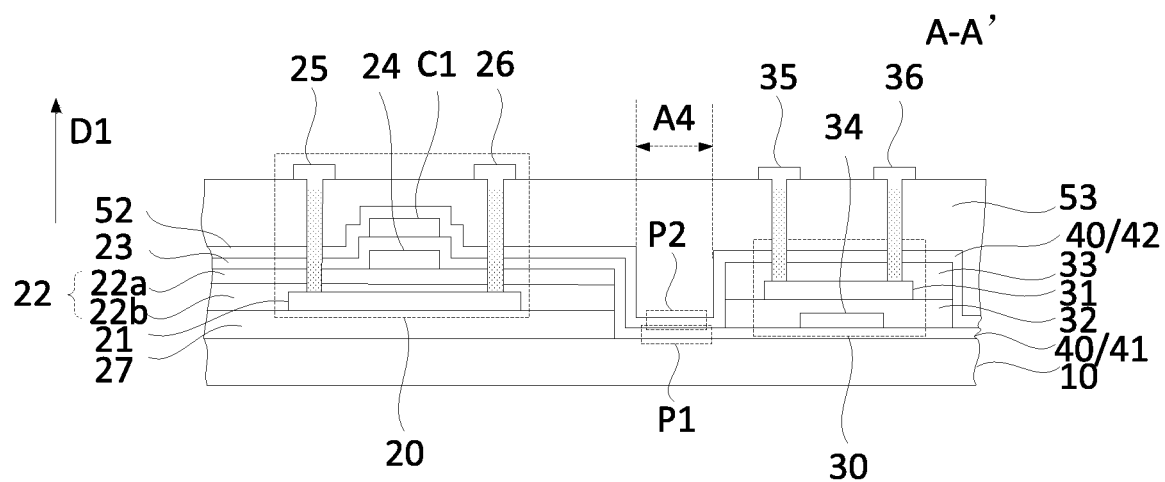
FIG. 8 is a cross-sectional view of FIG. 1 taken along line A-A'.

In one embodiment, as shown in FIG. 8, FIG. 8 is a cross-sectional view of FIG. 1 taken along line A-A'; the isolation layer 40 includes a first isolation layer 41 located between the first contact layer 32 and the substrate 10 and a second isolation layer 42 located on a side of the second contact layer 33 facing away from the substrate 10. For the setting of the first isolation layer 41, reference may be made to the isolation layer 40 in FIG. 6, and for the setting of the second isolation layer 42, reference may be made to the isolation layer 40 in FIG. 7.

The first isolation layer 41 includes a first portion P1, and the second isolation layer 42 includes a first portion P2, where the first portion P1 is in direct contact with the second portion P2, and the first portion P1 and the second portion P2 are located at least in a region A4 between the first thin film transistor 20 and the second thin film transistors 30.

The first portion P1 is in direct contact with the second portion P2 in the region A4 between the first thin film transistor 20 and the second thin film transistor 30, a portion of the second thin film transistor 30 located between the first isolation layer 41 and the second isolation layer 42 is isolated from the first thin film transistor 20 by the first portion P1 and the second portion P2, and the two-layer isolation layer 40 located between the first thin film transistor 20 and the second thin film transistor 30 can further reduce the mutual influence between the two types of thin film transistors.

Figure 9:
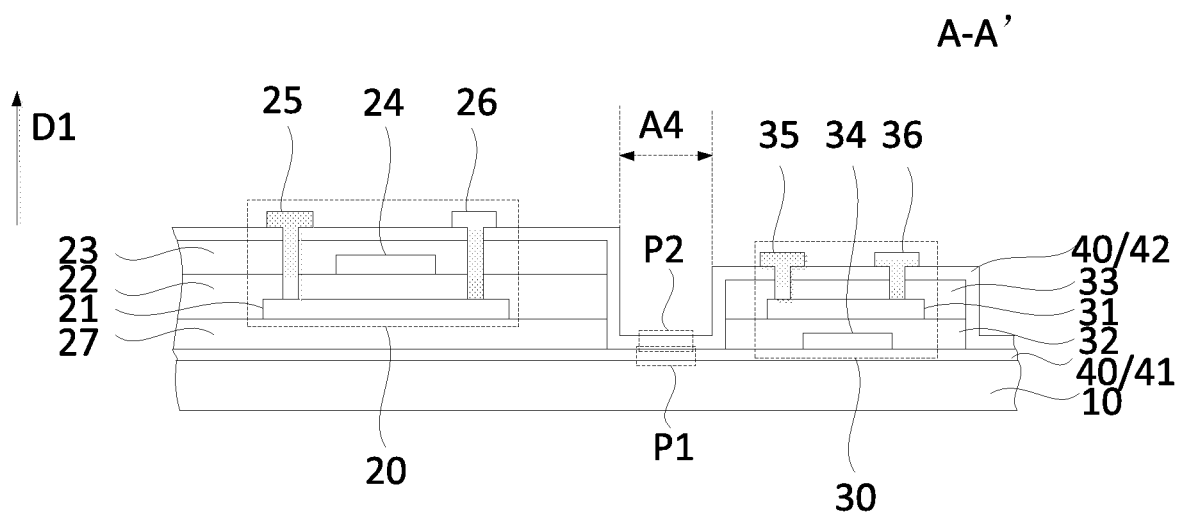
FIG. 9 is a cross-sectional view of FIG. 1 taken along line A-A'.

In one embodiment, the film layer position of the first isolation layer 41 and the film layer position of the second isolation layer 42 may be set as shown in FIG. 9, and FIG. 9 is a cross-sectional view of FIG. 1 taken along line A-A'. For the setting of the first isolation layer 41, reference may be made to the isolation layer 40 in FIG. 5, and for the setting of the second isolation layer 42, reference may be made to the isolation layer 40 in FIG. 7. A portion of the first thin film transistor 20 located between the first isolation layer 41 and the second isolation layer 42 and a portion of the second thin film transistor 30 located between the first isolation layers 41 and the second isolation layer 42 are isolated from each other by the first portion P1 and the second portion P2, reducing the influence of the diffusion of hydrogen ions in the first thin film transistor 20 on the second active layer 31 of the second thin film transistor 30.

Figure 10:
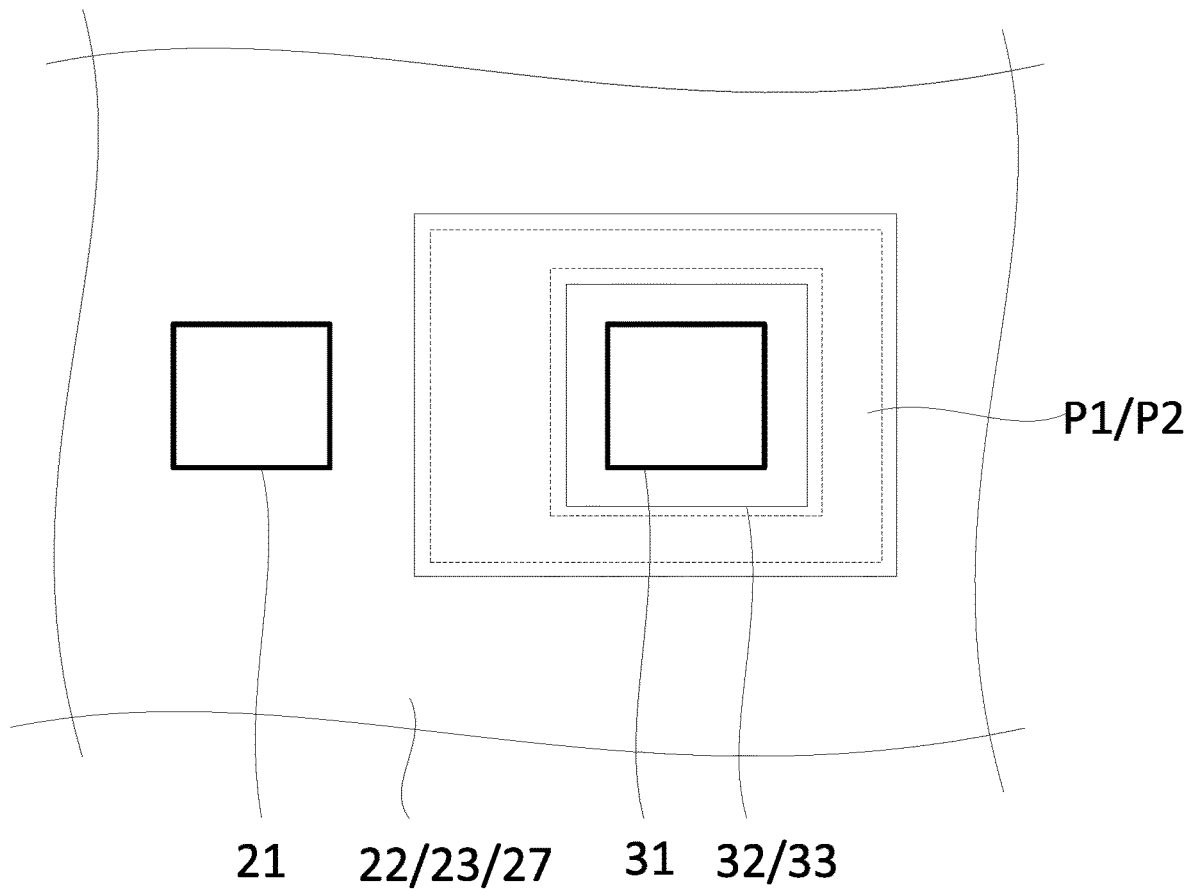
FIG. 10 is a partial cross-sectional view of another array substrate according to an embodiment of the present disclosure.

FIG. 10 is a partial cross-sectional view of another array substrate according to an embodiment of the present disclosure. In one embodiment, with reference to FIGS. 8 to 10, in a plane parallel to the substrate 10, the first portion P1 and the second portion P2 each surround the second active layer 31, the first contact layer 32, and the second contact layer 33. Therefore, the first isolation layer 41 and the second isolation layer 42 together form a stereoscopic isolation structure, and the second active layer 31, the first contact layer 32, and the second contact layer 33 are located in the stereoscopic isolation structure, preventing the influence of hydrogen ions outside the isolation structure on the second active layer 31.

The isolation layer 40 may be formed in a manner of Atomic Layer Deposition (ALD). The isolation layer 40 is formed layer by layer in the form of a monoatomic film, so that the isolation layer 40 has a uniform thickness, excellent consistency, and a dense structure. Therefore, the isolation layer 40 can prevent impurity ions from diffusing to the second active layer 31 through the isolation layer 40 and play a good isolation role. In addition, the isolation layer 40 formed in the manner of ALD has good step coverage. When the first contact layer 32 and the second contact layer 33 are island-shaped, the isolation layer 40 may cover the upper surface S3 and the side surface S4 of the second contact layer 33, which is beneficial for forming the stereoscopic isolation structure and on the premise that the isolation effect is ensured, is beneficial for reducing the distance between the first thin film transistor 20 and the second thin film transistor 30.

The isolation layer 40 is made of a material including alumina. An alumina film has good electrical insulation property and impurity ion blocking property. In other embodiments of the present disclosure, other oxide films, such as titanium oxide, indium oxide, tin oxide, zinc oxide, or silicon oxide, may also be selected for the isolation layer.

Figure 11:
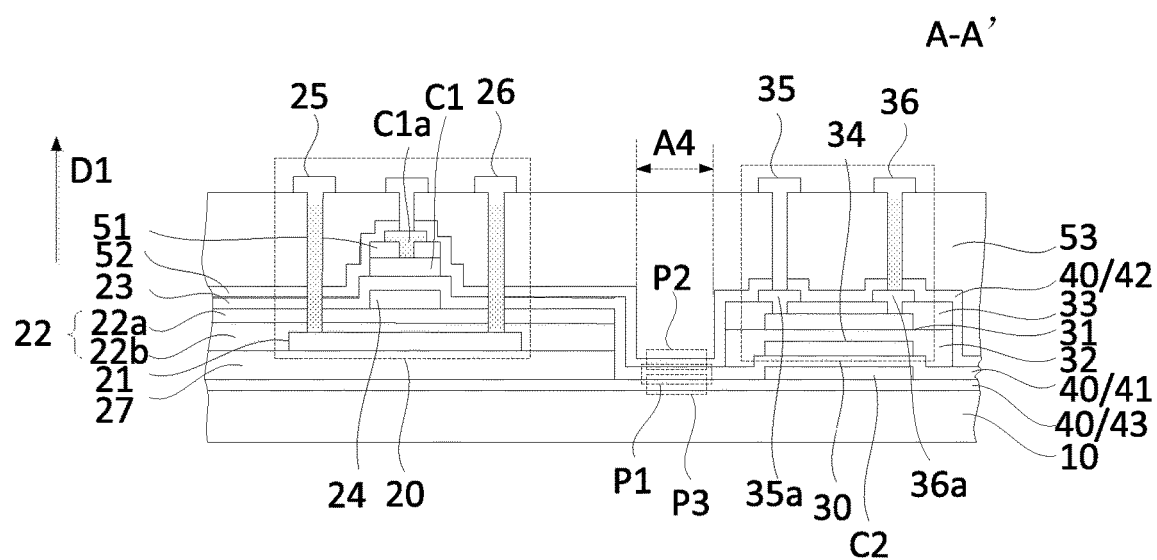
FIG. 11 is a cross-sectional view of FIG. 1 taken along line A-A'.

FIG. 11 is a cross-sectional view of FIG. 1 taken along line A-A'. As shown in FIG. 11, the isolation layer 40 further includes a third isolation layer 43, the third isolation layer 43 is located between the substrate 10 and the second thin film transistor 30 and extends from the region where the second thin film transistor 30 is located to the region where the first thin film transistor 20 is located; in the region where the first thin film transistor 20 is located, the third isolation layer 43 is located between the substrate 10 and the buffer layer 27 and may cover the entire upper surface of the substrate 10.

The third isolation layer 43 includes a third portion P3, and in the region A4 between the first thin film transistor 20 and the second thin film transistor 30, the third portion P3 is in direct contact with the first portion P1 of the first isolation layer 41.

The first gate insulating layer 22 of the first thin film transistor 20 includes a silicon nitride layer 22a, where the silicon nitride layer 22a is rich in hydrogen ions. In a hydrogen supplement process of the polysilicon layer, the silicon nitride layer 22a may provide hydrogen ions to the polysilicon layer.

In the region where the first thin film transistor 20 is located, the first isolation layer 41 and the third isolation layer 43 limit the diffusion path of hydrogen ions in the direction where the film layers are stacked. In addition, in the region A4, the first portion P1 of the first isolation layer 41 is in direct contact with the third portion P3 of the third isolation layer 43, limiting the diffusion path of hydrogen ions in the direction parallel to the substrate 10. In one embodiment, limiting the hydrogen ions to a limited region is beneficial for maintaining the concentration of hydrogen ions in the first active layer 21; in another embodiment, limiting the diffusion of hydrogen ions into the region where the second thin film transistor 30 is located is beneficial for reducing the influence on the second active layer 31.

As shown in FIG. 11, the array substrate may include a first insulating layer 51 and a second insulating layer 52, the first insulating layer 51 is located on a side of the first interlayer insulating layer 23 facing away from the substrate 10, and the second insulating layer 52 is located on a side of the first insulating layer 51 facing away from the substrate 10, where the second isolation layer 42 extends from the region where the second thin film transistor 30 is located to the region where the first thin film transistor 20 is located, and the second insulating layer 52 may be formed by a portion of the second isolation layer 42 in the region where the first thin film transistor 20 is located. In the stacking sequence of the film layers, the first insulating layer 51 and the first contact layer 32 may be made of the same material and formed in the same process, or the first insulating layer 51 and the second contact layer 33 may be made of the same material and formed in the same process, simplifying the manufacturing process.

As shown in FIG. 11, the first plate C1 is located between the first interlayer insulating layer 23 and the first insulating layer 51, the first plate C1 overlaps the first gate 24, and the first plate C1 and the first gate 24 may form a storage capacitor in the driving circuit. The second gate 34 of the second thin film transistor 30 is located between the first isolation layer 41 and the first contact layer 32. The second gate 34 and the first plate C1 may be made of the same material and formed in the same process.

As shown in FIG. 11, the second plate C2 is located between the substrate 10 and the second gate 34 and may be located between the first isolation layer 41 and the substrate 10; the second plate C2 overlaps the second gate 34 and may form the storage capacitor. The second plate C2 and the first gate 24 may be made of the same material and formed in the same process.

The first plate C1 and the second plate C2 may be respectively manufactured at the same layer as the second gate 34 and the first gate 24, simplifying the manufacturing process of the array substrate while the number of film layers is reduced.

As shown in FIGS. 8 and 11, the array substrate further includes a third insulating layer 53, and the third insulating layer 53 is located on a side of the second isolation layer 42 facing away from the substrate 10, covers the second isolation layer 42, and extends from the region where the first thin film transistor 20 is located to the region where the second thin film transistor 30 is located. The first source 25 and the first drain 26 of the first thin film transistor 20 and the second source 35 and the second drain 36 of the second thin film transistor 30 are disposed at the same layer and made of the same material. The first source 25, the first drain 26, the second source 35, and the second drain 36 each are located on a side of the first active layer 21 and the second active layer 31 facing away from the substrate 10 and on a side of the third insulating layer 53 facing away from the substrate 10.

The third insulating layer 53 is made of an organic material, such as acrylic, polyimide (PI), or benzocyclobutene (BCB). The third insulating layer 53 may provide a flat surface for the first source 25, the first drain 26, the second source 35, and the second drain 36 that are formed subsequently. In addition, the thickness of the third insulating layer 53 may be greater than the thickness of the first gate insulating layer 22 or greater than the thickness of the first interlayer insulating layer 23, so that the third insulating layer 53 can reduce a parasitic capacitance between the first source 25, the first drain 26, the second source 35 and the second drain 36 and the metal film layers located on a side of the third insulating layer facing toward the substrate 10.

The second isolation layer 42 is located between the third insulating layer 53 and the second active layer 31, and the impurity ions in the third insulating layer 53 hardly pass through the second isolation layer 42 to affect the second active layer 31.

Figure 12:
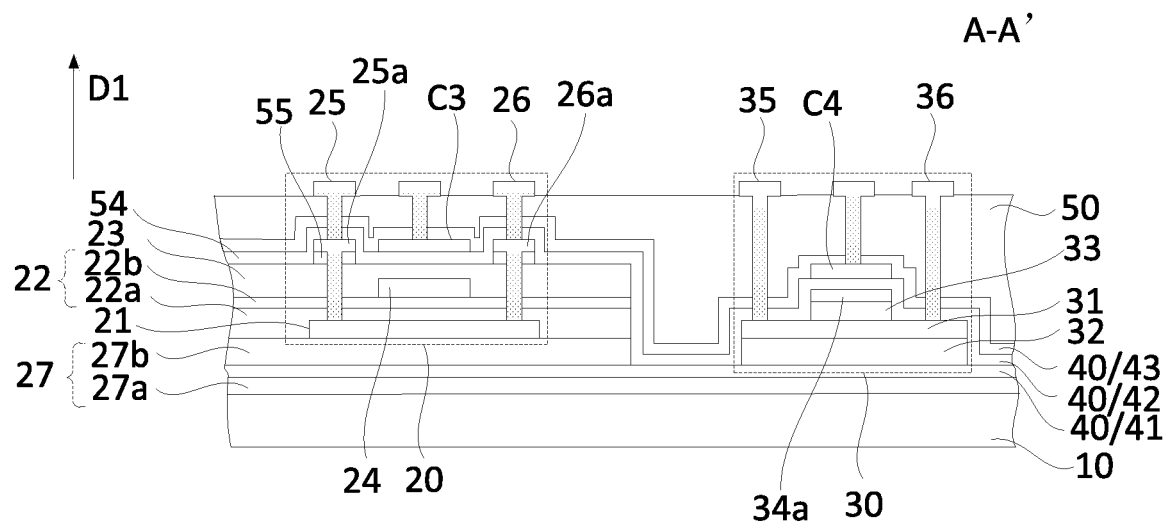
FIG. 12 is a cross-sectional view of FIG. 1 taken along line A-A'.

FIG. 12 is a cross-sectional view of FIG. 1 taken along line A-A'. As shown in FIG. 12, for the first thin film transistor 20, the buffer layer 27, the first active layer 21, the first gate insulating layer 22, the first gate 24, the first interlayer insulating layer 23, a fourth insulating layer 54, and the first source 25/the first drain 26 are stacked in sequence on the substrate 10. The first source 25 and the first drain 26 are separately connected to the first active layer 21. The first gate insulating layer 22 and the first interlayer insulating layer 23 extend from the region where the first thin film transistor 20 is located toward the region where the second thin film transistor 30 is located, and stop in a position close to the region where the second thin film transistor 30 is located. The isolation layer 42 extends from the region where the second thin film transistor 30 is located to the region where the first thin film transistor 20 is located, and forms the fourth insulating layer 54 in the region where the first thin film transistor 20 is located.

As shown in FIG. 12, the buffer layer 27 includes a first buffer layer 27a and a second buffer layer 27b, where the second buffer layer 27b is located on a side of the first buffer layer 27a facing away from the substrate 10, and a portion of the first isolation layer 41 located in the region where the first thin film transistor 20 is located is located between the first buffer layer 27a and the second buffer layer 27b. In other embodiments, the buffer layer 27 may include a first buffer layer 27a, or may include a second buffer layer 27b.

As shown in FIG. 12, the first thin film transistor 20 and the second thin film transistor 30 may each be a top-gate transistor. For the second thin film transistor 30, the first contact layer 32, the second active layer 31, the second contact layer 33, a third gate 34a, a second isolation layer 42, and the second source 35/the second drain 36 are stacked in sequence on the substrate 10. A projection of the second contact layer 33 on the substrate 10 may coincide with a projection of the third gate 34a on the substrate 10, and the second contact layer 33 may be smaller than the second active layer 31. Therefore, the second source 35 and the second drain 36 may be connected to the second active layer 31 after passing through the second isolation layer 42.

As shown in FIG. 12, the third plate C3 and the first gate 24 overlap and form a capacitor, and the third plate C3 is located on a side of the first gate 24 facing away from the substrate 10. The fourth plate C4 and the third gate 34a overlap and form a capacitor, and the fourth plate C4 is located on a side of the third gate 34a facing away from the substrate 10. The third plate C3 and the fourth plate C4 may be formed in the same process step.

As shown in FIG. 12, the third isolation layer 43 is located on a side of the second isolation layer 42 facing away from the substrate 10. The third isolation layer 43 covers the second isolation layer 42, the third plate C3 and the fourth plate C4.

Figure 13:
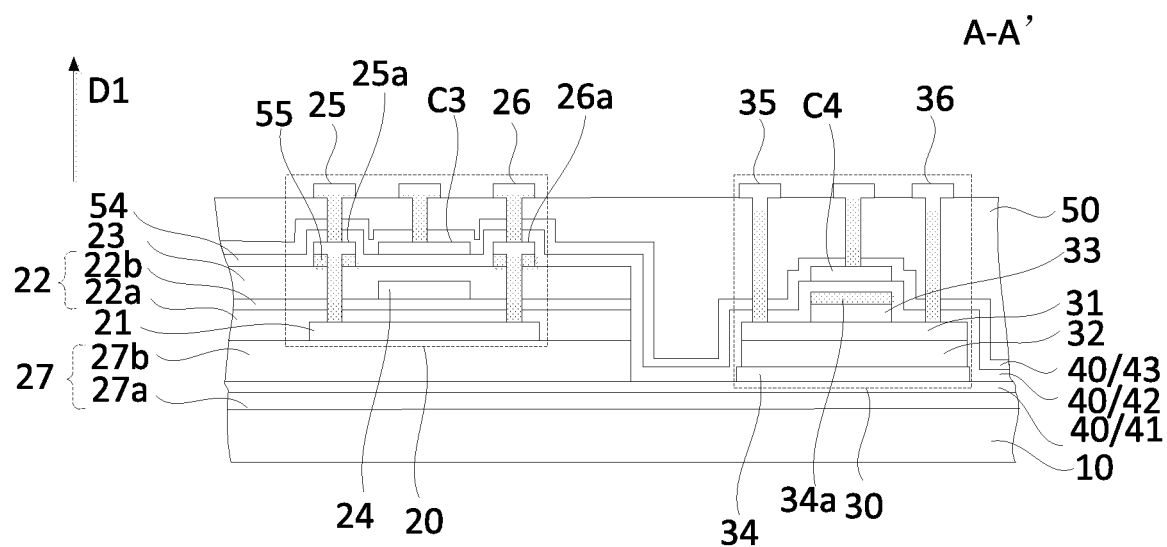
FIG. 13 is a cross-sectional view of FIG. 1 taken along line A-A'.

FIG. 13 is a cross-sectional view of FIG. 1 taken along line A-A'. Compared with the array substrate in FIG. 12, the array substrate in FIG. 13 has at least the following difference: the second thin film transistor 30 further includes a second gate 34 in addition to the third gate 34a. The second gate 34 is located between the substrate 10 and the first contact layer 32, and the third gate 34a is located on a side of the second contact layer 33 facing away from the second active layer 31. Therefore, the second thin film transistor 30 is a double-gate transistor, and the second gate 34 and the third gate 34a are respectively located on a lower side and an upper side of the second active layer 31. In the embodiment, the second gate 34 and the first gate 24 may be formed in the same manufacturing process using the same material, which is beneficial for simplifying the manufacturing process.

Figure 14:
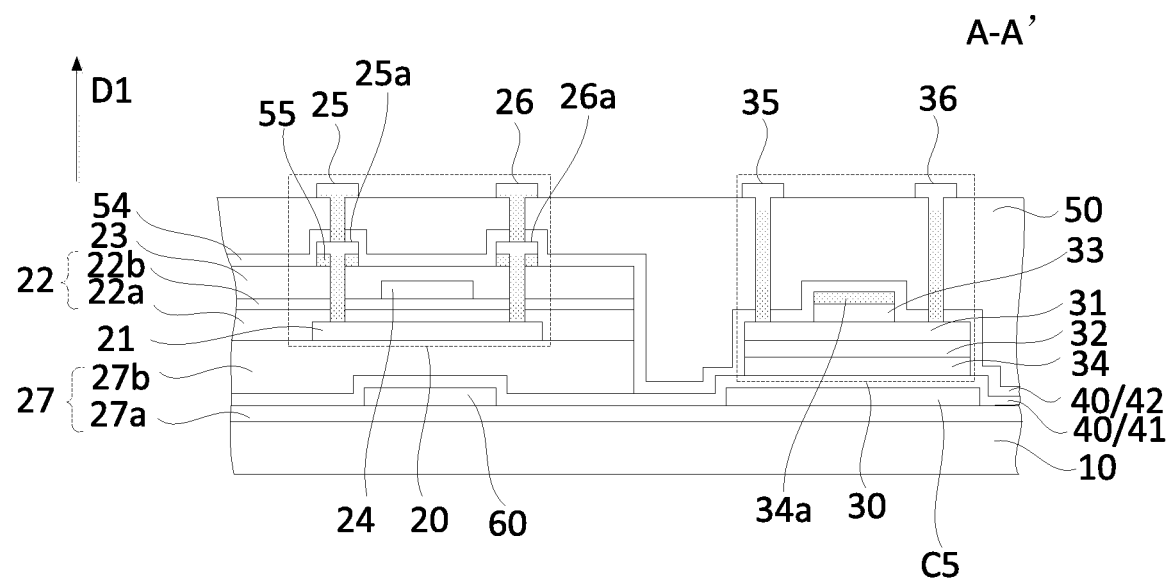
FIG. 14 is a cross-sectional view of FIG. 1 taken along line A-A'.

FIG. 14 is a cross-sectional view of FIG. 1 taken along line A-A'. As shown in FIG. 14, the first thin film transistor 20 in the array substrate is a top-gate transistor, where the first gate 24 is located on a side of the first active layer 21 facing away from the substrate 10; the second thin film transistor 30 is a two-gate transistor and includes a second gate 34 and a third gate 34a, where the second gate 34 is located between the substrate 10 and the second active layer 31, and the third gate 34a is located on a side of the second active layer 31 facing away from the substrate 10. The array substrate further includes a light-blocking layer 60 and a fifth plate C5. In one embodiment, the light-blocking layer 60 is located between the substrate 10 and the first active layer 21 and overlaps the first thin film transistor 20. The light-blocking layer 60 can be used for blocking ambient light to prevent external ambient light from entering into the first active layer 21, and thus preventing an undesired change in conduction characteristics of the first thin film transistor. The fifth plate C5 is located between the substrate 10 and the second gate 34. The fifth plate C5 and the second gate 34 overlap and form a capacitor. The light-blocking layer 60 and the fifth plate C5 may be disposed at the same layer, that is, the light-blocking layer 60 and the fifth plate C5 are formed in the same manufacturing process using the same material. The fifth plate C5 acting as one of the plates of the capacitor is disposed between the second gate 34 and the substrate 10 and at the same layer as the light-blocking layer 60, so that an additional plate for forming the capacitor can be avoided from being disposed on a side of the third gate 34a facing away from the substrate 10 while the manufacturing process is simplified, and the number of metal film layers is reduced and the influence on the second active layer 31 is reduced after the second active layer 31 is manufactured. In addition, the first gate 24 and the second gate 34 may be formed in the same manufacturing process using the same material, which is beneficial for simplifying the manufacturing process.

Considering that the manufacturing process of the first source 25/the first drain 26 of the first thin film transistor 20 will affect the second active layer of the second thin film transistor 30, a connection portion may be provided at a position where the source/the drain is connected to the active layer, which is specifically described as follows.

In one embodiment, as shown in FIG. 11, for the first thin film transistor 20, the first source 25 and the first drain 26 are separately in direct contact with the first active layer 21. The second thin film transistor 30 further includes a second source connection portion 35a and a second drain connection portion 36a. The second source connection portion 35a and the second drain connection portion 36a each are located between the second contact layer 33 and the second isolation layer 42. The second source 35 is connected to the second active layer 31 through the second source connection portion 35a, and the second drain 36 is connected to the second active layer 31 through the second drain connection portion 36a. The first source 25, the first drain 26, the second source 35, and the second drain 36 each are disposed at the same layer and made of the same material, and are formed in the same process. Therefore, before the first source 25/the first drain 26 is formed, the second source connection portion 35a and the second drain connection portion 36a may be formed firstly. When a via hole corresponding to the first source 25/the first drain 26 is formed, a via hole corresponding to the second source 35/the second drain 36 formed at the same time no longer exposes the second active layer 31.

As shown in FIG. 11, the first plate C1 may also include a first plate connection portion C1a, and may be formed in the same process as the second source connection portion 35a and the second drain connection portion 36a.

In one embodiment, as shown in FIG. 12, for the second thin film transistor 20, the second source 35 and the second drain 36 are separately in direct contact with the second active layer 31. The first thin film transistor 20 further includes a first source connection portion 25a and a first drain connection portion 26a. The first source connection portion 25a and the first drain connection portion 26a each are located between the fourth insulating layer 54 and the first active layer 21. The first source 25 is connected to the first active layer 21 through the first source connection portion 25a, and the first drain 26 is connected to the first active layer 21 through the first drain connection portion 26a. The first source 25, the first drain 26, the second source 35, and the second drain 36 are disposed at the same layer and made of the same material, and are formed in the same process. Therefore, a hydrofluoric acid cleaning process for the first active layer 21 is performed before the first source connection portion 25a and the first drain connection portion 26a are formed, and in the hydrofluoric acid cleaning process, the second active layer 31 will not be exposed by the via hole, and therefore, the second active layer 31 will not be affected.

As shown in FIG. 12, the first thin film transistor 20 further includes a cushion layer 55, the cushion layer is located between a film layer where the first source connection portion 25a and the first drain connection portion 26a are located and the first active layer 21, the first source connection portion 25a is connected to the first active layer 21 through a via hole in the cushion layer 55, and the first drain connection portion 26a is connected to the first active layer 21 through a via hole in the cushion layer 55. The cushion layer 55 and the second contact layer 33 may be made of the same material.

Figure 15:
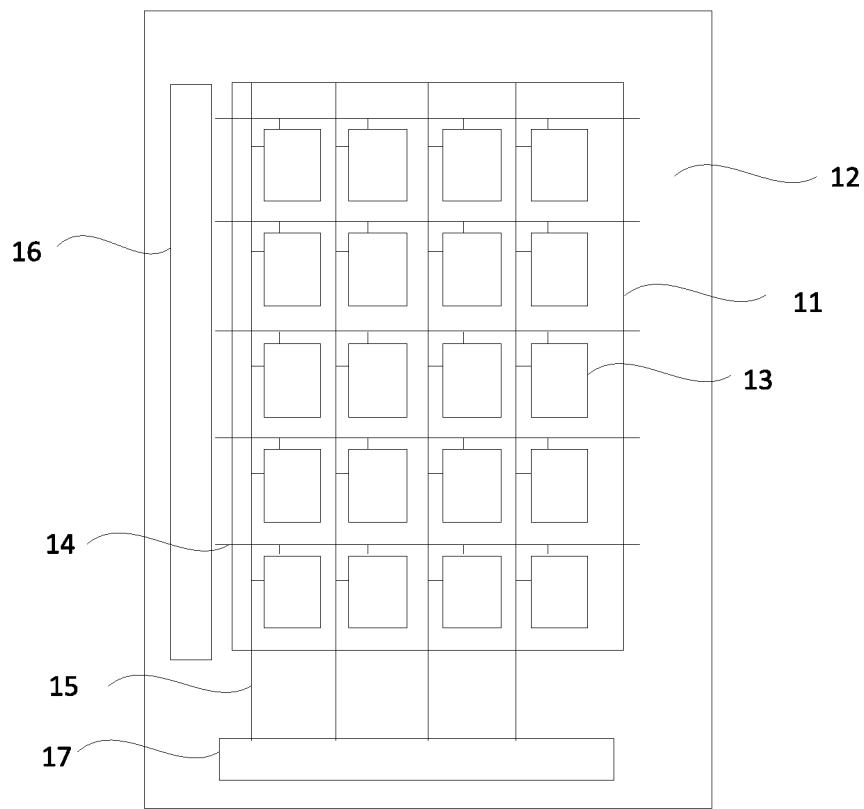
FIG. 15 is a top view of an array substrate according to an embodiment of the present disclosure.

FIG. 15 is a top view of an array substrate according to an embodiment of the present disclosure, and as shown in FIG. 15, the array substrate includes a display region 11 and a non-display region 12. In the display region 11, the array substrate includes a plurality of pixel circuits 13, a plurality of scan lines 14, and a plurality of data lines 15. The pixel circuit 13 may include the first thin film transistor 20 and the second thin film transistor 30 described above. In the non-display region 12, the array substrate includes a scan driving circuit 16 and a data driving circuit 17, where the scan driving circuit 16 may include the first thin film transistor 20 and the second thin film transistor 30 described above.

Figure 16:
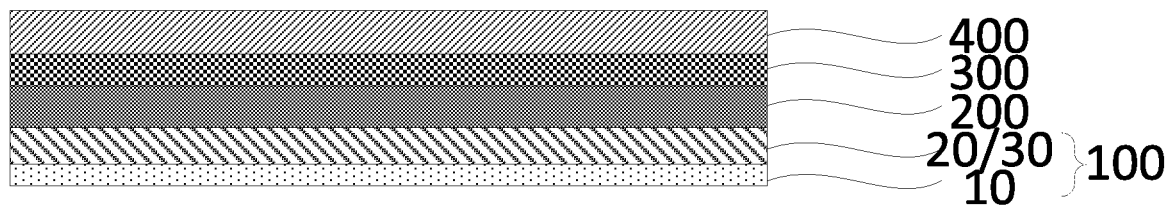
FIG. 16 is a cross-sectional view of a display panel according to an embodiment of the present disclosure.

FIG. 16 is a cross-sectional view of a display panel according to an embodiment of the present disclosure. The display panel includes the above-mentioned array substrate 100, a planarization layer 200, a light-emitting element layer 300, and an encapsulation layer 400. The planarization layer 200 is located between the array substrate 100 and the light-emitting element layer 300, and the encapsulation layer 400 is located on a side of the light-emitting element layer 300 facing away from the array substrate 100. The planarization layer 200 is located on a side of the first thin film transistor 20 and the second thin film transistor 30 facing away from the substrate 10. The light-emitting element layer 300 includes a plurality of light-emitting elements. The pixel circuit 13 in the array substrate 100 is used for driving the light-emitting element to emit light, and the light-emitting element may be an organic light-emitting diode, an inorganic light-emitting diode, and the like.

Figure 17:
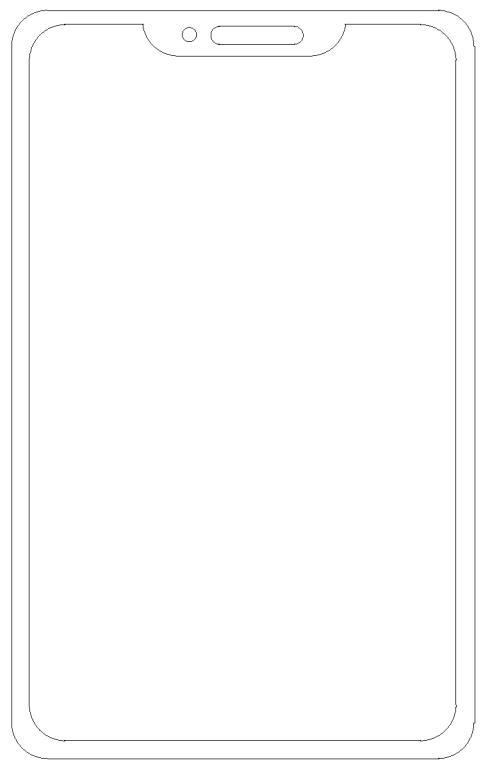
FIG. 17 is a schematic diagram of a display device according to an embodiment of the present disclosure.

A display device provided by an embodiment of the present disclosure may include the display panel provided by any one of the embodiments described above. In one embodiment, the display device may be any electronic product having a display function, and includes, but is not limited to, the following categories: a television, a laptop, a desktop display, a tablet computer, a digital camera, a mobile phone, a smart bracelet, smart glasses, a vehicle-mounted display, medical equipment, industrial control equipment, a touch interactive terminal, etc. FIG. 17 is a schematic diagram of a display device according to an embodiment of the present disclosure, and FIG. 17 schematically illustrates the display device of the present disclosure with the mobile phone.

The array substrate provided by the embodiment of the present disclosure may be manufactured by the following method.

Figure 18:
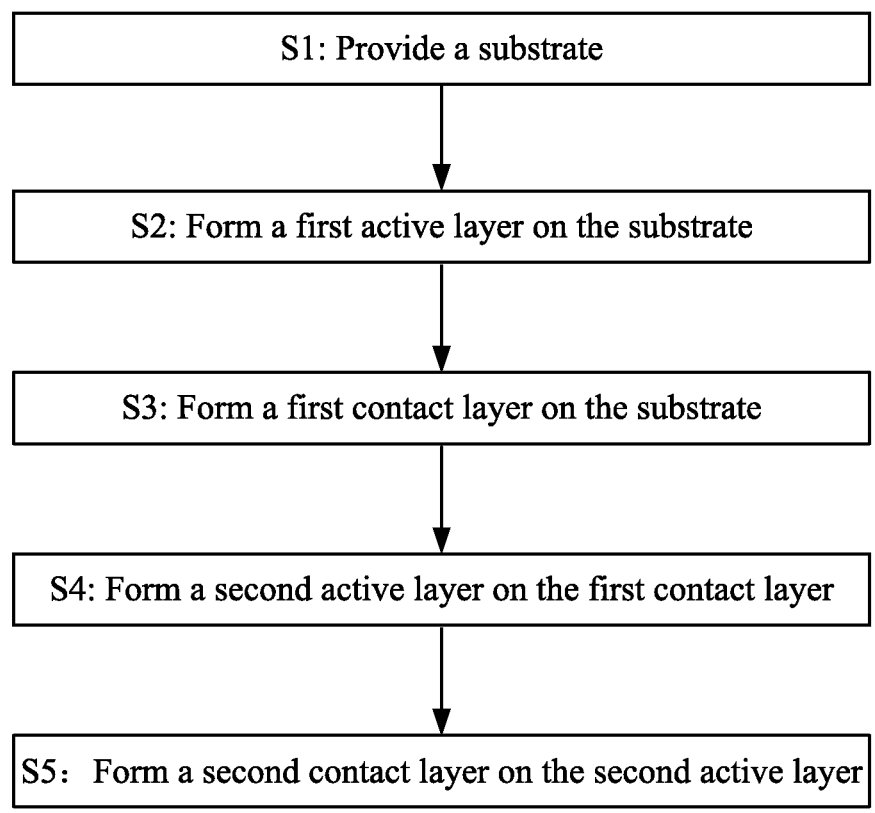
FIG. 18 is a flowchart of a manufacturing method of an array substrate according to an embodiment of the present disclosure.

FIG. 18 is a flowchart of a manufacturing method of an array substrate according to an embodiment of the present disclosure. As shown in FIG. 18, steps described below are included.

In step S1, a substrate 10 is provided.

In step S2, a first active layer 21 formed on the substrate 10, where the first active layer 21 is an active layer of a first thin film transistor 20 and is a polysilicon layer.

In step S3, a first contact layer 32 is formed on the substrate 10.

In one embodiment, a first isolation layer 41 may be formed on the substrate 10 in a manner of atomic layer deposition; and the first contact layer 32 is formed on the first isolation layer 41.

In step S4, a second active layer 31 is formed on the first contact layer 32, where the second active layer 31 is an active layer of a second thin film transistor 30 and is an oxide semiconductor layer.

In step S5, a second contact layer 33 is formed on the second active layer 31.

In one embodiment, the second isolation layer 42 is formed on the second contact layer 33 in the manner of atomic layer deposition; a portion of the first isolation layer 41 and a portion of the second isolation layer 42 beyond the second active layer 31, the first contact layer 32, and the second contact layer 33 include portions that are in direct contact with each other, and the portions that are in direct contact with each other are the first portion P1 of the first contact layer 32 and the second portion P2 of the second contact layer 33.

In the array substrate manufactured by the above-mentioned manufacturing method, the first contact layer 32 and the second contact layer 33 each are in direct contact with the second active layer 31, and the second active layer 31, the first contact layer 32, and the second contact layer 33 each are island-shaped. The above-mentioned manufacturing method can reduce the influence of the first thin film transistor on the second thin film transistor.

What is claimed is:

1. An array substrate, comprising:
a substrate, a first thin film transistor, and a second thin film transistor, wherein the first thin film transistor and the second thin film transistor are located on a same side of the substrate;
wherein the first thin film transistor comprises a first active layer, the first active layer is a polysilicon layer, the second thin film transistor comprises a second active layer, the second active layer is an oxide semiconductor layer, and the second thin film transistor further comprises a first contact layer and a second contact layer;
wherein the first contact layer is located between the substrate and the second active layer, the second contact layer is located on a side of the second active layer facing away from the substrate, the first contact layer and the second contact layer each are in contact with the second active layer, and the second active layer, the first contact layer, and the second contact layer each are island-shaped;
wherein the array substrate further comprises an isolation layer;
wherein the isolation layer is located between the first contact layer and the substrate, or the isolation layer is located on a side of the second contact layer facing away from the substrate, or the isolation layer comprises a portion located between the first contact layer and the substrate and a portion located on a side of the second contact layer facing away from the substrate; and
wherein the isolation layer overlaps the second thin film transistor.

2. The array substrate of claim 1, wherein the first contact layer and the second contact layer each are made of a material of silicon oxide.

3. The array substrate of claim 1, wherein the isolation layer is formed in a manner of atomic layer deposition.

4. The array substrate of claim 3, wherein a material of the isolation layer comprises alumina.

5. The array substrate of claim 3, wherein the isolation layer comprises a first isolation layer and a second isolation layer, wherein the first isolation layer is located between the first contact layer and the substrate, and the second isolation layer is located on the side of the second contact layer facing away from the substrate; and
the first isolation layer comprises a first portion, the second isolation layer comprises a second portion, and the first portion is in contact with the second portion; and
the first portion and the second portion are located at least in a region between the first thin film transistor and the second thin film transistor.

6. The array substrate of claim 5, wherein in a plane parallel to the substrate, the first portion and the second portion each surround the second active layer, the first contact layer, and the second contact layer.

7. The array substrate of claim 5, wherein the first thin film transistor further comprises a buffer layer, a first gate insulating layer, a first gate, a first interlayer insulating layer, a first source, and a first drain;
the buffer layer is located between the substrate and the first active layer, the first gate insulating layer is located on a side of the first active layer facing away from the substrate, the first gate is located on a side of the first gate insulating layer facing away from the substrate, the first interlayer insulating layer is located on a side of the first gate facing away from the substrate, the first source and the first drain each are located on a side of the first interlayer insulating layer facing away from the substrate, and the first source and the first drain are separately connected to the first active layer; and
the first isolation layer extends from a region where the second thin film transistor is located to a region where the first thin film transistor is located, and forms the first interlayer insulating layer.

8. The array substrate of claim 7, wherein the buffer layer and the first gate insulating layer each do not overlap the second active layer, the first contact layer, and the second contact layer.

9. The array substrate of claim 7, wherein the first gate insulating layer comprises a silicon nitride layer.

10. The array substrate of claim 9, wherein the isolation layer further comprises a third isolation layer, the third isolation layer is located between the substrate and the second thin film transistor and extends from the region where the second thin film transistor is located to the region where the first thin film transistor is located, and a portion of the third isolation layer extending to the region where the first thin film transistor is located is located between the substrate and the buffer layer; and
the third isolation layer comprises a third portion, and in the region between the first thin film transistor and the second thin film transistor, the third portion is in contact with the first portion.

11. The array substrate of claim 7, further comprising:
a first insulating layer and a second insulating layer;
wherein the first insulating layer is located on the side of the first interlayer insulating layer facing away from the substrate, and the second insulating layer is located on a side of the first insulating layer facing away from the substrate;
wherein the first insulating layer and the first contact layer are made of a same material, or the first insulating layer and the second contact layer are made of a same material; and
wherein the second isolation layer extends from the region where the second thin film transistor is located to the region where the first thin film transistor is located, and forms the second insulating layer.

12. The array substrate of claim 5, further comprising:
a third insulating layer, which extends from a region where the first thin film transistor is located to a region where the second thin film transistor is located, and the third insulating layer is made of an organic material;
wherein the first thin film transistor further comprises a first source and a first drain, the first source and the first drain being separately connected to the first active layer;
wherein the second thin film transistor further comprises a second source and a second drain, the second source and the second drain being separately connected to the second active layer;
wherein the first source, the first drain, the second source, and the second drain are disposed at a same layer, made of a same material, and located on a side of the first active layer and the second active layer facing away from the substrate; and
wherein the third insulating layer is located between a film layer where the first source, the first drain, the second source and the second drain are located and a film layer where the second isolation layer is located.

13. The array substrate of claim 5, wherein the first thin film transistor further comprises a buffer layer, a first gate insulating layer, a first gate, a first interlayer insulating layer, a first source, a first drain, and a fourth insulating layer;
the buffer layer is located between the substrate and the first active layer, the first gate insulating layer is located on a side of the first active layer facing away from the substrate, the first gate is located on a side of the first gate insulating layer facing away from the substrate, the first interlayer insulating layer is located on a side of the first gate facing away from the substrate, the first source and the first drain each are located on a side of the first interlayer insulating layer facing away from the substrate, and the fourth insulating layer is located between a film layer where the first source and the first drain are located and the first interlayer insulating layer;
the first source and the first drain are separately connected to the first active layer; and
the second isolation layer extends from a region where the second thin film transistor is located to a region where the first thin film transistor is located and firms the fourth insulating layer in the region where the first thin film transistor is located.

14. The array substrate of claim 13, wherein the second thin film transistor further comprises a second gate and a third gate, the second gate is located between the substrate and the first contact layer, and the third gate is located on a side of the second contact layer facing away from the second active layer.

15. The array substrate of claim 5, wherein the first thin film transistor further comprises a first source and a first drain, the second thin film transistor further comprises a second source and a second drain, wherein the first source, the first drain, the second source, and the second drain are disposed at a same layer, made of a same material, and located on a side of the first active layer and the second active layer facing away from the substrate;
the second isolation layer extends from a region where the second thin film transistor is located to a region where the first thin film transistor is located and forms a second insulating layer, wherein the second insulating layer is located between a film layer where the first source and the first drain are located and the first active layer;
each of the first source and the first drain is connected to the first active layer through a respective one of a plurality of via holes of the second insulating layer; and
the second thin film transistor further comprises a second source connection portion and a second drain connection portion, wherein the second source connection portion and the second drain connection portion each are located between the second contact layer and the second isolation layer, the second source is connected to the second active layer through the second source connection portion, and the second drain is connected to the second active layer through the second drain connection portion.

16. The array substrate of claim 5, wherein the first thin film transistor further comprises a first source and a first drain, the second thin film transistor further comprises a second source and a second drain, wherein the first source, the first drain, the second source, and the second drain are disposed at a same layer, made of a same material, and located on a side of the first active layer and the second active layer facing away from the substrate;
the second isolation layer extends from a region where the second thin film transistor is located to a region where the first thin film transistor is located and forms a fourth insulating layer, wherein the fourth insulating layer is located between a film layer where the first source and the first drain are located and the first active layer;
each of the second source and the second drain is connected to the second active layer through a respective one of a plurality of via holes of the second isolation layer; and
the first thin film transistor further comprises a first source connection portion and a first drain connection portion, wherein the first source connection portion and the first drain connection portion each are located between the fourth insulating layer and the first active layer, the first source is connected to the first active layer through the first source connection portion, and the first drain is connected to the first active layer through the first drain connection portion.

17. A display panel, comprising:
an array substrate, a planarization layer and a light-emitting element layer, wherein the planarization layer is located between the array substrate and the light-emitting element layer;
wherein the array substrate, comprising: a substrate, a first thin film transistor, and a second thin film transistor, wherein the first thin film transistor and the second thin film transistor are located on a same side of the substrate;
wherein the first thin film transistor comprises a first active layer, the first active layer is a polysilicon layer, the second thin film transistor comprises a second active layer, the second active layer is an oxide semiconductor layer, and the second thin film transistor further comprises a first contact layer and a second contact layer, wherein the first contact layer is located between the substrate and the second active layer, the second contact layer is located on a side of the second active layer facing away from the substrate, the first contact layer and the second contact layer each are in contact with the second active layer, and the second active layer, the first contact layer, and the second contact layer each are island-shaped;

wherein the array substrate further comprises an isolation layer;

wherein the isolation layer is located between the first contact layer and the substrate, or the isolation layer is located on a side of the second contact layer facing away from the substrate, or the isolation layer comprises a portion located between the first contact layer and the substrate and a portion located on a side of the second contact layer facing away from the substrate; and wherein the isolation layer overlaps the second thin film transistor.

18. A display device, comprising the display panel of claim 17.

* * * * *